(12) United States Patent
Ting et al.

(10) Patent No.: US 11,991,464 B2
(45) Date of Patent: May 21, 2024

(54) LIGHT DETECTION ELEMENT

(71) Applicant: Innolux Corporation, Miao-Li County (TW)

(72) Inventors: Chin-Lung Ting, Miao-Li County (TW); Ming Chun Tseng, Miao-Li County (TW); Ho-Tien Chen, Miao-Li County (TW); Kung-Chen Kuo, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 276 days.

(21) Appl. No.: 17/482,439

(22) Filed: Sep. 23, 2021

(65) Prior Publication Data

US 2022/0116560 A1    Apr. 14, 2022

(30) Foreign Application Priority Data

Oct. 12, 2020   (CN) .......................... 202011084117.4

(51) Int. Cl.
*H04N 25/709*     (2023.01)
*H01L 27/146*     (2006.01)
*H04N 25/71*      (2023.01)
*H04N 25/75*      (2023.01)

(52) U.S. Cl.
CPC ..... *H04N 25/709* (2023.01); *H01L 27/14614* (2013.01); *H04N 25/745* (2023.01); *H04N 25/75* (2023.01)

(58) Field of Classification Search
CPC ............ H01L 27/14614; H04N 25/709; H04N 25/745; H04N 25/75; H04N 25/77
See application file for complete search history.

(56) References Cited

U.S. PATENT DOCUMENTS 4,755,696 A * 7/1988 Pickett ............... G01R 19/0038
326/119
4,841,166 A * 6/1989 Harnden ............ H03K 17/6871
327/365

(Continued)

FOREIGN PATENT DOCUMENTS

CN        108052898        5/2018
CN        109922722        6/2019

OTHER PUBLICATIONS

"Office Action of China Counterpart Application", issued on Mar. 15, 2024, pp. 1-7.

*Primary Examiner* — Michael B. Pierorazio
(74) *Attorney, Agent, or Firm* — JCIPRNET

(57) ABSTRACT

A light detection element, including a first light detection unit, a second light detection unit, and a driving transistor, is provided. The first light detection unit includes a first transistor and a first light sensing unit. The first transistor and the first light sensing unit are electrically connected. The second light detection unit and the first light detection unit are electrically connected. The second light detection unit includes a second light sensing unit and a second transistor. The second light sensing unit and the second transistor are electrically connected. The driving transistor has a gate terminal. The gate terminal is electrically connected to the first light sensing unit and the second light sensing unit. In a time interval, the first transistor is not turned on and the second transistor is turned on.

12 Claims, 12 Drawing Sheets

(56) References Cited

U.S. PATENT DOCUMENTS

| | | | | |
|---|---|---|---|---|
| 4,903,182 | A * | 2/1990 | Pilukaitis | H03K 17/04123 363/19 |
| 5,625,312 | A * | 4/1997 | Kawakami | H03K 17/163 327/287 |
| 6,057,897 | A * | 5/2000 | Ichikawa | G09G 3/3648 349/48 |
| 6,127,998 | A * | 10/2000 | Ichikawa | G09G 3/3688 345/100 |
| 6,157,429 | A * | 12/2000 | Miyawaki | G02F 1/136277 349/149 |
| 6,166,792 | A * | 12/2000 | Miyawaki | G02F 1/136277 349/143 |
| 6,212,110 | B1 | 4/2001 | Sakamoto | G11C 7/18 365/207 |
| 7,586,477 | B2 * | 9/2009 | Lee | G09G 3/3677 345/94 |
| 8,893,164 | B1 * | 11/2014 | Teller | G06Q 30/0252 725/12 |
| 8,893,185 | B2 * | 11/2014 | Wasilewski | H04L 63/102 726/28 |
| 9,148,605 | B1 * | 9/2015 | Wang | H04N 25/75 |
| 9,345,087 | B2 * | 5/2016 | Yu | H05B 45/48 |
| 10,931,906 | B2 * | 2/2021 | Kim | H01L 27/14612 |
| 11,709,231 | B2 * | 7/2023 | Yoo | G01S 7/4808 356/5.01 |
| 2002/0036606 | A1 * | 3/2002 | Ichikawa | G09G 3/3688 345/87 |
| 2002/0085843 | A1 * | 7/2002 | Mann | E03C 1/057 396/374 |
| 2003/0005454 | A1 * | 1/2003 | Rodriguez | H04N 21/2385 348/E7.071 |
| 2003/0040278 | A1 * | 2/2003 | Iliadis | H03F 1/523 455/252.1 |
| 2006/0020469 | A1 * | 1/2006 | Rast | G09G 3/344 704/270 |
| 2006/0256133 | A1 * | 11/2006 | Rosenberg | G06F 3/013 345/619 |
| 2007/0023786 | A1 * | 2/2007 | Johnson | H01L 27/14609 348/E3.018 |
| 2007/0132438 | A1 * | 6/2007 | Jang | H02M 1/32 323/282 |
| 2007/0157247 | A1 * | 7/2007 | Cordray | G06Q 30/02 348/E5.006 |
| 2009/0133051 | A1 * | 5/2009 | Hildreth | H04N 21/42204 725/28 |
| 2009/0138805 | A1 * | 5/2009 | Hildreth | H04N 21/4751 715/745 |
| 2010/0058400 | A1 * | 3/2010 | Nicas | H04N 7/17318 725/74 |
| 2010/0118193 | A1 * | 5/2010 | Boyden | G09G 5/006 348/554 |
| 2010/0141578 | A1 * | 6/2010 | Horiuchi | H04N 21/42204 345/158 |
| 2011/0058105 | A1 * | 3/2011 | Nagashima | H04N 21/4318 348/602 |
| 2011/0138416 | A1 * | 6/2011 | Kang | H04N 21/4821 725/39 |
| 2011/0155892 | A1 * | 6/2011 | Neter | H04N 25/59 250/208.1 |
| 2012/0075168 | A1 * | 3/2012 | Osterhout | G06F 3/017 345/8 |
| 2012/0117103 | A1 * | 5/2012 | Farrelly | H04L 67/10 707/769 |
| 2012/0192234 | A1 * | 7/2012 | Britt | H04N 21/4882 725/98 |
| 2012/0280112 | A1 * | 11/2012 | Collins | H04N 25/771 250/206 |
| 2012/0324550 | A1 * | 12/2012 | Wasilewski | H04N 21/25891 726/5 |
| 2013/0014136 | A1 * | 1/2013 | Bhatia | H04N 21/47815 725/9 |
| 2013/0059601 | A1 * | 3/2013 | Tran | H04N 21/41407 455/456.1 |
| 2013/0248686 | A1 * | 9/2013 | Tohyama | G01J 5/0846 438/59 |
| 2014/0167200 | A1 * | 6/2014 | Sun | H01L 27/1463 257/443 |
| 2014/0359647 | A1 * | 12/2014 | Shoemake | H04N 21/6582 725/10 |
| 2015/0026708 | A1 * | 1/2015 | Ahmed | H04N 21/812 725/12 |
| 2015/0106851 | A1 * | 4/2015 | Pauli | G06F 3/0386 725/52 |
| 2015/0188425 | A1 * | 7/2015 | Chang | H02M 3/1588 323/271 |
| 2015/0309687 | A1 * | 10/2015 | Herigstad | H04N 21/478 715/784 |
| 2015/0373408 | A1 * | 12/2015 | Yurasits | H04H 60/45 725/12 |
| 2016/0127786 | A1 * | 5/2016 | Langer | H04N 21/4542 725/28 |
| 2016/0190198 | A1 * | 6/2016 | Kwon | H01L 27/1464 257/435 |
| 2016/0323643 | A1 * | 11/2016 | Panchaksharaiah | H04N 21/4753 |
| 2018/0035166 | A1 * | 2/2018 | Truong | H04N 21/4147 |
| 2018/0152761 | A1 * | 5/2018 | Truong | H04N 21/4524 |
| 2019/0327435 | A1 * | 10/2019 | Kim | H04N 25/76 |
| 2020/0168656 | A1 * | 5/2020 | Mase | H01L 31/03046 |
| 2020/0395285 | A1 * | 12/2020 | Dong | H01L 22/32 |
| 2021/0106283 | A1 * | 4/2021 | Zhong | A61B 5/725 |
| 2021/0150178 | A1 * | 5/2021 | Wang | G06V 40/1388 |
| 2021/0250532 | A1 * | 8/2021 | Akiyama | H04N 25/575 |
| 2021/0295076 | A1 * | 9/2021 | Li | G06V 40/40 |
| 2021/0357606 | A1 * | 11/2021 | Cao | H10K 59/12 |
| 2021/0406501 | A1 * | 12/2021 | Zhu | G06V 10/147 |
| 2022/0058362 | A1 * | 2/2022 | Lee | G06V 40/13 |
| 2022/0165082 | A1 * | 5/2022 | Lu | H10K 59/38 |
| 2022/0165085 | A1 * | 5/2022 | Xiong | H10K 59/122 |
| 2022/0320050 | A1 * | 10/2022 | Zha | H01L 25/0753 |
| 2022/0406858 | A1 * | 12/2022 | Zhao | H10K 59/65 |
| 2023/0031456 | A1 * | 2/2023 | Balasekaran | H01L 27/1462 |
| 2023/0164460 | A1 * | 5/2023 | Park | H04N 25/773 348/230.1 |
| 2023/0176219 | A1 * | 6/2023 | Lu | G02B 26/101 356/4.01 |
| 2023/0178578 | A1 * | 6/2023 | Wang | G06V 10/147 257/72 |

* cited by examiner

LIGHT DETECTION ELEMENT

CROSS-REFERENCE TO RELATED APPLICATION

This application claims the priority benefit of China application serial no. 202011084117.4, filed on Oct. 12, 2020. The entirety of the above-mentioned patent application is hereby incorporated by reference herein and made a part of this specification.

BACKGROUND

Technical Field

This disclosure relates to a detection element, and in particular to a light detection element.

Description of Related Art

When a light detection element is applied to a display, a pixel light source is generally used as a detection light source. The light detection element detects a reflected light of an object to determine whether the object is touching the display currently, and may further determine a touch position of the object. However, if a display content of the display is dark at that point of time, there is no reflected light for the light detection element to detect. In other words, the light detection element is affected by the display content of the display, which causes its detection result to be incorrect. For example, in addition to the dark display content of the display resulting in no reflected light detection, changes in the color and brightness of the display content also interfere with the detection result of the light detection element. In addition, the light detection element is also easily affected by ambient light during the detection.

SUMMARY

This disclosure provides a light detection element, which can effectively reduce impact of noise on a detection result, so as to prevent misjudgment.

According to an embodiment of the disclosure, a light detection element includes a first light detection unit, a second light detection unit, and a driving transistor. The first light detection unit includes a first transistor and a first light sensing unit. The first transistor and the first light sensing unit are electrically connected. The second light detection unit and the first light detection unit are electrically connected. The second light detection unit includes a second light sensing unit and a second transistor. The second light sensing unit and the second transistor are electrically connected. The driving transistor has a gate terminal. The gate terminal is electrically connected to the first light sensing unit and the second light sensing unit. In a time interval, the first transistor is not turned on, and the second transistor is turned on.

In an embodiment of the disclosure, the light detection element also includes a light source. The light source operates synchronously with the first transistor.

In an embodiment of the disclosure, a terminal of the first transistor is coupled to a first voltage, and a terminal of the second transistor is coupled to a second voltage, and an electric potential of the first voltage is different from an electric potential of the second voltage.

In an embodiment of the disclosure, the first transistor is controlled by a first signal, and the second transistor is controlled by a second signal.

In an embodiment of the disclosure, the light detection element further includes a control circuit. The control circuit is configured to determine whether to allow the second signal to control the second transistor.

In an embodiment of the disclosure, the control circuit includes a readout circuit.

In an embodiment of the disclosure, the readout circuit does not include an analog-to-digital converter.

In an embodiment of the disclosure, the light detection element also includes a feedback circuit. The feedback circuit is configured to determine that a reflected light is detected by the light detection element when a voltage at the gate terminal is a third voltage. The feedback circuit is configured to determine that a direct light is detected by the light detection element when the voltage at the gate terminal is a fourth voltage.

In an embodiment of the disclosure, the control circuit enables the second signal when the feedback circuit determined that the reflected light is detected by the light detection element, so as to allow the second signal to control the second transistor to be turned on.

In an embodiment of the disclosure, the control circuit disables the second signal when the feedback circuit determined that the direct light is detected by the light detection element, so as to allow the second signal to control the second transistor to not be turned on.

According to an embodiment of the disclosure, a light detection element includes a control circuit and a sensing pixel. The sensing pixel is connected to the control circuit through a sensing line, so as to transmit a sensed signal to the control circuit, and the sensing pixel includes a first transistor, a second transistor, and a driving transistor. In a time interval, the first transistor is not turned on, and the second transistor is turned on.

In an embodiment of the disclosure, a sensing pixel includes a first light detection unit, and the first light detection unit includes a first transistor and a first light sensing unit. The first transistor and the first light sensing unit are electrically connected. A second light detection unit is electrically connected to the first light detection unit, and the second light detection unit includes a second light sensing unit and the second transistor. The second light sensing unit and the second transistor are electrically connected. A driving transistor has a gate terminal, and the gate terminal is electrically connected to the first light sensing unit and the second light sensing unit.

To make the aforementioned more comprehensible, several embodiments accompanied by drawings are described in detail as follows.

DESCRIPTION OF THE EMBODIMENTS

Figure 1:
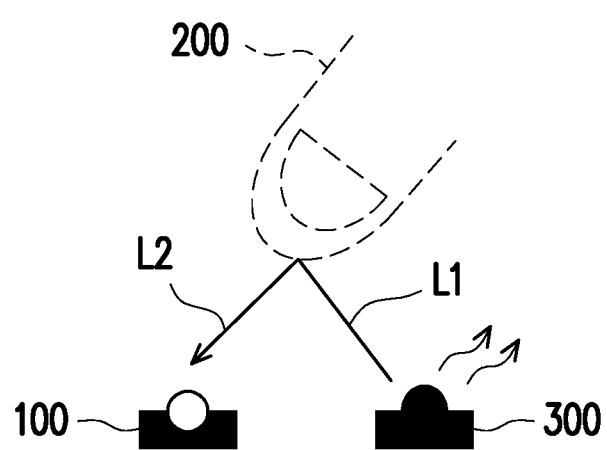
FIG. 1 is a schematic diagram of a light detection element configured to detect a reflected light according to an embodiment of the disclosure.

This disclosure may be understood with reference to detailed description in conjunction with accompanying drawings as follows. It should be noted that, for ease of understanding by a reader and for clarity of the drawings, only a part of the electronic component is illustrated in the multiple drawings of this disclosure, and specific elements in the drawings are not drawn according to actual scale. In addition, the number and size of each element in the drawing are only for illustrative purpose, and are not meant to limit the scope of the disclosure.

In the following descriptions and claims, words such as "including", "containing", and "having" are open-ended words, thus, they should be interpreted as "containing, but not limited to . . . ".

It should be understood that when an element or film layer is referred to as being "on" or "connected to" another element or film layer, it may be directly on the another element or film layer or directly connected to the another element or layer, or there is an intermediary element or film layer between the two (in an indirect scenario). Conversely, when an element is said to be "directly on" or "directly connected to" another element or film layer, there is no intermediary element or film layer between the two.

Terms such as "first", "second", "third" . . . in the specification of the disclosure may be used herein to describe various constituent elements, but the constituent elements are not restricted by these terms. These terms are only used to distinguish a single constituent element from other constituent elements in the specification. The same terms may not be used in the claims, and the elements in the claims may be renamed "first", "second", "third" . . . according to an order declared by the elements in the claims. Therefore, in the following description, the first constituent element may be renamed as the second constituent element in the claims.

In the text, terms such as "about", "approximately", "substantially", and "roughly" are generally interpreted as being 10%, 5%, 3%, 2%, 1%, or 0.5% of a given value or range. The quantity given here is an approximate quantity, that is, even without specifically mentioning "about", "approximately", "substantially", or "roughly", the meaning of the terms "about", "approximately", "substantially" and "roughly" may still be implied. In addition, phases such as "a range is from a first value to a second value" or "a range is between a first value and a second value" imply that the range includes the first value, the second value, and other values in between.

In some embodiments of the disclosure, terms such as "connected" or "interconnected" with regards to bonding and connection, unless specifically defined, may refer to two structures that are in direct contact, or two structures that are not in direct contact with another structure disposed between the two structures. Moreover, the terms regarding bonding and connection may also include scenarios where both structures are movable or both structures are fixed. In addition, the term "coupled" includes any direct and indirect electrical connection means.

Reference will now be made in detail to the exemplary embodiments of the disclosure, and examples of the exemplary embodiments are illustrated in the accompanying drawings. Whenever possible, the same reference numerals are used in the drawings and the description to indicate the same or similar parts.

FIG. 1 is a schematic diagram of a light detection element configured to detect a reflected light according to an embodiment of the disclosure. With reference to FIG. 1, a light detection element 100 of the embodiment is configured to detect a reflected light L2 from an object 200. A light source 300 is configured to output a light L1. The light L1 is a visible light or an invisible light. The light source 300 that outputs the visible light is, for example, a laser light source. The light source 300 that outputs invisible light is, for example, an infrared light source. The light source 300 may be a display light source or a non-display light source according to product design. In the embodiment, the light source 300 is described as a non-display light source, but is not limited thereto. In other words, when the light source 300 outputting the light L1 is a non-display light source, information of the display content is not included. The object 200 may be a pen or a finger of a user. The object 200 is configured to reflect the light L1 and reflects the reflected light L2 to the light detection element 100. In the embodiment, light sensing units D1/D2 include, for example, a photoelectric transistor or a PIN photo diode.

The light detection element 100 of the embodiment is applicable to an electronic device. The electronic device of the disclosure may include a display device, an antenna device, a sensing device, a touch display, a curved display, or a free shape display, but is not limited thereto. The electronic device may be a bendable or flexible electronic device. The electronic device may include, for example, a light-emitting diode (LED), liquid crystal, fluorescence, phosphor, quantum dot (QD), other suitable display media, or a combination of the foregoing, but is not limited thereto. The display may be a self-luminous display, such as an organic LED (OLED) display, a mini LED display, a micro LED display, or a QD (such as QLED, QDLED) display. The disclosure does not limit the type of the display.

Figure 2:
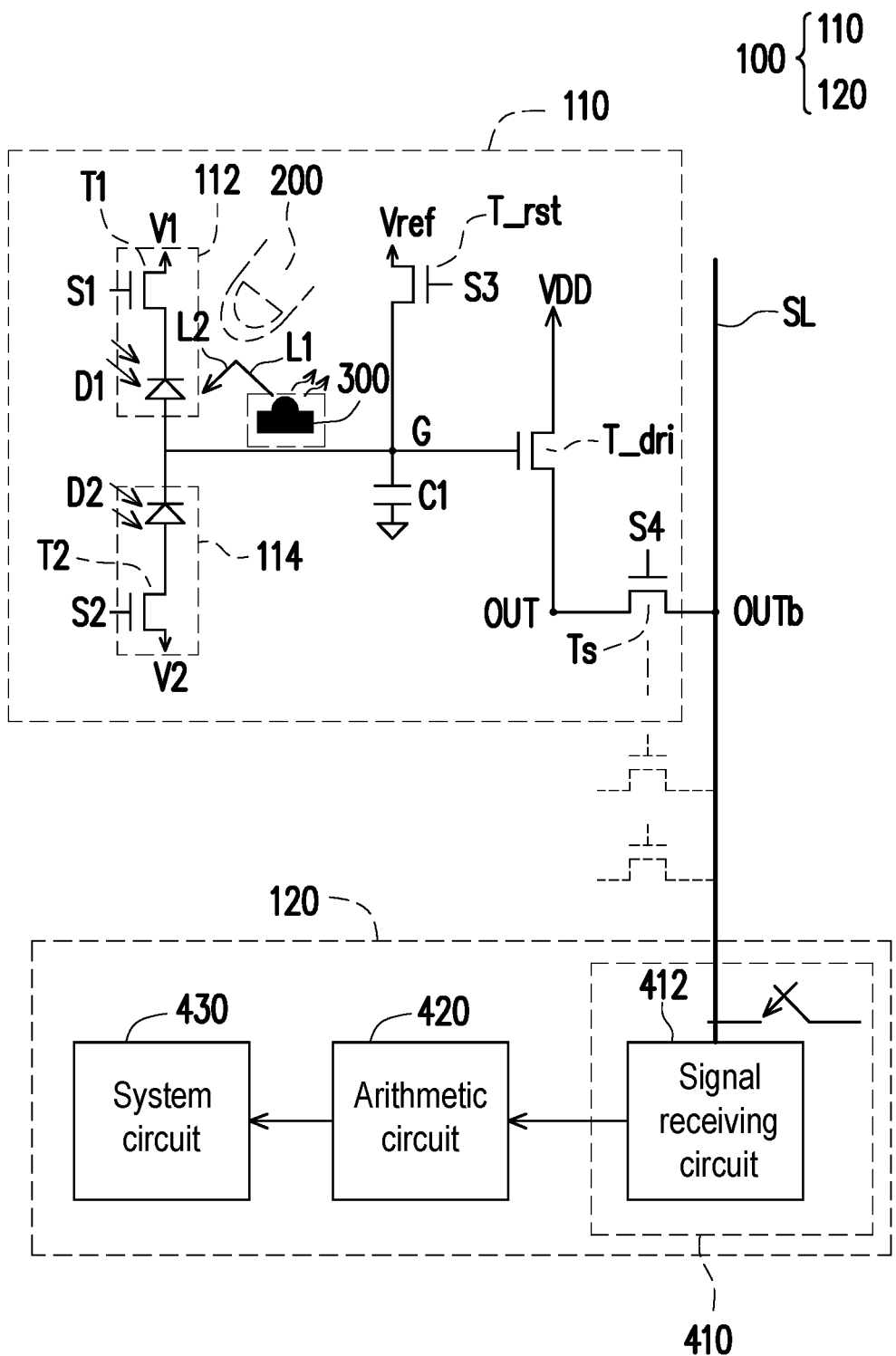
FIG. 2 is a schematic structural diagram of the light detection element of the embodiment in FIG. 1.

FIG. 2 is a schematic structural diagram of the light detection element of the embodiment in FIG. 1. With reference to FIG. 2, the light detection element 100 of the embodiment includes a sensing pixel 110 and a control circuit 120. The sensing pixel 110 is connected to the control circuit 120 through a sensing line SL, so as to transmit a sensed signal to the control circuit 120. The sensing pixel 110 includes a first light detection unit 112 and a second light detection unit 114, and the first light detection unit 112 is electrically connected to the second light detection unit 114. More specifically, the sensing pixel 110 includes a first transistor T1, a first light sensing unit D1, a second light sensing unit D2, a second transistor T2, and a driving transistor T_dri. The first transistor T1, the first light sensing unit D1, the second light sensing unit D2, and the second transistor T2 are electrically connected. With reference to FIG. 2, the first transistor T1, the first light sensing unit D1, the second light sensing unit D2, and the second transistor T2 of the embodiment are connected in series, and a product circuit may be disposed in parallel or the product circuit may include a series connection and a parallel connection concurrently, but is not limited thereto. The driving transistor T_dri has a gate terminal G. The gate terminal G is electrically connected to an anode terminal of the first light sensing unit D1 and a cathode terminal of the second light sensing unit D2. A terminal of the first transistor T1 is coupled to a first voltage, such as a high-level voltage V1, and another terminal is coupled to a cathode terminal of the first light sensing unit D1. A terminal of the second transistor T2 is coupled to a second voltage, such as a low-level voltage V2, and another terminal is coupled to an anode terminal of the second light sensing unit D2, but is not limited thereto. The first transistor T1 is controlled by a first signal S1, and the second transistor T2 is controlled by a second signal S2. A terminal of the driving transistor T_dri is coupled to a first system voltage VDD, and another terminal is coupled to a first output terminal OUT. The driving transistor T_dri is controlled by a voltage of the gate terminal G.

In the embodiment, the light detection element 100 further includes the light source 300 that operates synchronously with the first transistor T1. In other words, the light source 300 is lit when the first transistor T1 is turned on. In the embodiment, the sensing pixel 110 further includes a reset transistor T_rst, a sampling transistor Ts, and a storage capacitor C1.

Figure 3:
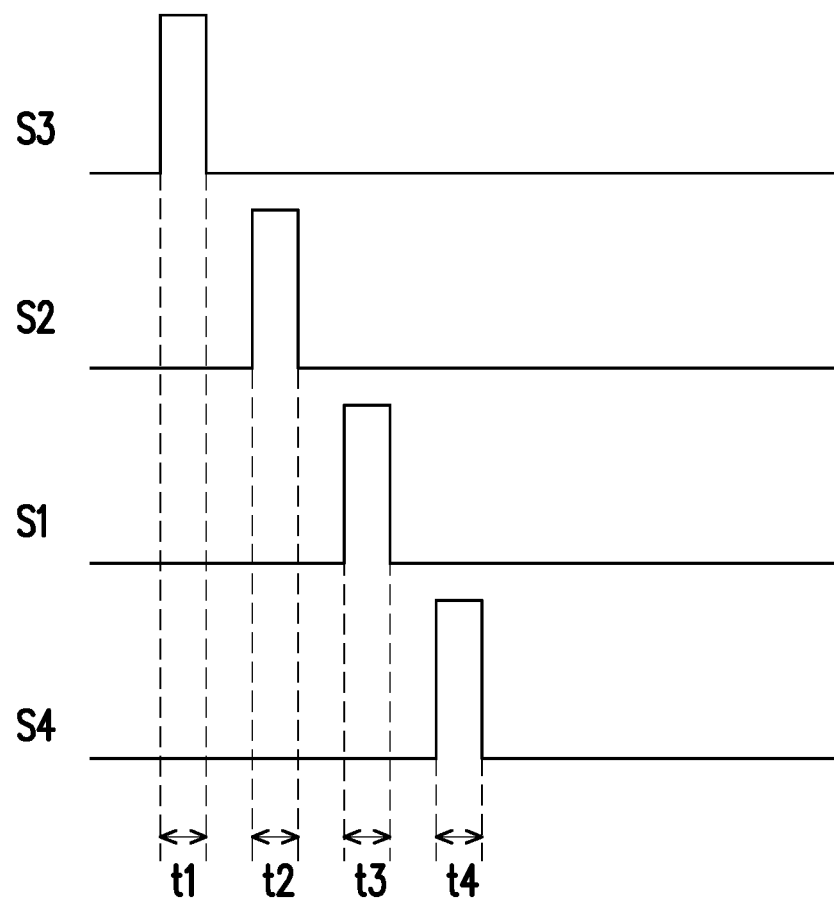
FIG. 3 is a signal timing diagram of the control signal configured to control each of the transistors of the embodiment in FIG. 2.
Figure 4:
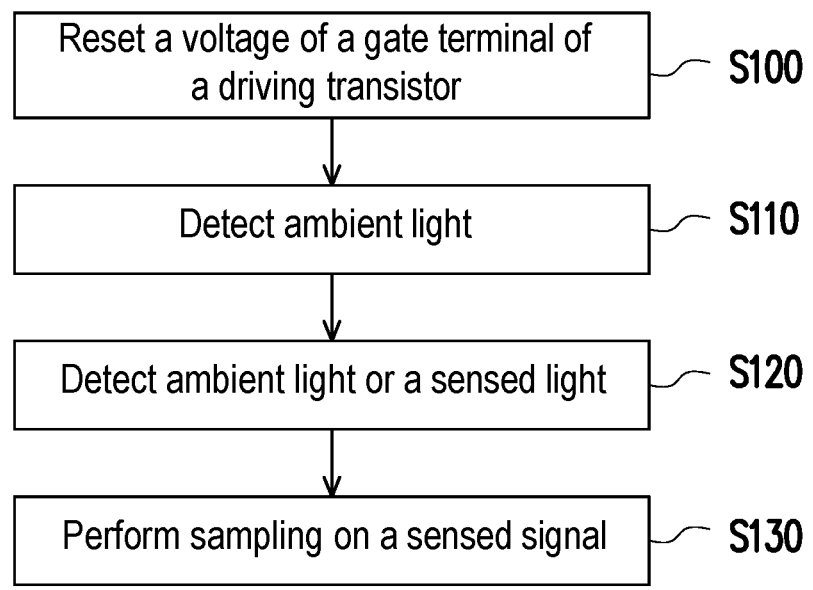
FIG. 4 is an operation flowchart of the light detection element of the embodiment in FIG. 2.

FIG. 3 is a signal timing diagram of the control signal configured to control each of the transistors of the embodiment in FIG. 2. FIG. 4 is an operation flowchart of the light detection element of the embodiment in FIG. 2. With reference to FIGS. 2 to 4, in Step S100, a reset signal S3 turns on the reset transistor T_rst in a time interval t1, so as to reset a terminal of the storage capacitor C1 to a reference voltage Vref. That is, the voltage of the gate terminal G of the driving transistor T_dri is reset to the reference voltage Vref. Therefore, a voltage of the first output terminal OUT is the reference voltage Vref minus a threshold voltage Vth of the driving transistor T_dri, that is, Vref-Vth, and a voltage of a second output terminal OUTb is a third voltage, such as a low-level voltage L. In the time interval t1, the first transistor T1 and the second transistor T2 are not turned on.

In the Step S110, the light detection element 100 is configured to detect ambient light. In the Step S110, the second signal S2 turns on the second transistor T2 in a time interval t2, and the second light sensing unit D2 detects the ambient light. In the time interval t2, the first transistor T1, the reset transistor T_rst, and the driving transistor T_dri are not turned on. Therefore, the storage capacitor C1 discharges the second transistor T2, so that the voltage of the gate terminal G is pulled down from the reference voltage Vref to the low-level voltage L. At this time, since the driving transistor T_dri is not turned on, the voltage of the first output terminal OUT is maintained at the reference voltage Vref minus the threshold voltage Vth of the driving transistor T_dri, that is, Vref-Vth, and the voltage of the second output terminal OUTb is still the low-level voltage L.

In the Step S120, the light detection element 100 is configured to detect the ambient light or a sensed light. For example, the light detection element 100 detects the ambient light in the Step S120 when the finger 200 does not exist. Conversely, when the finger 200 is close to the light source 300, the light L1 is reflected to form the reflected light L2, and the reflected light L2 is reflected to the light detection element 100. Therefore, at this time, the light detection element 100 detects the sensed light (that is, the reflected light L2) in the Step S120.

In the Step S120, the first signal S1 turns on the first transistor T1 in a time interval t3, and the light source 300 is also lit to output the light L1, which means that the light source 300 is operating synchronously with the first transistor T1. In detail, the light source 300 of the embodiment may be controlled to turn on or off by another set of control circuit (not shown). The light source 300 is turned on concurrently by the other set of control circuit (not shown), when the first signal S1 turns on the first transistor T1 in the time interval t3, but is not limited thereto. In the time interval t3, the second transistor T2 and the reset transistor T_rst are not turned on. When the finger 200 is close to the light source 300, the first light sensing unit D1 detects the reflected light L2, and the high-level voltage V1 charges the storage capacitor C1, so that the voltage at the gate terminal G is pulled up to a high-level voltage H, so as to turn on the driving transistor T_dri. Therefore, the voltage of the first output terminal OUT is a fourth voltage, for example, high-level voltage H minus the threshold voltage Vth of the driving transistor T_dri, that is, H-Vth.

Next, in Step S130, the light detection element 100 performs sampling on the sensed signal. In a time interval t4, a sampling signal S4 turns on the sampling transistor Ts. In the time interval t4, the first transistor T1, the second transistor T2, and the reset transistor T_rst are not turned on. The voltage of the second output terminal OUTb is the high-level voltage H minus the threshold voltage Vth of the driving transistor T_dri, that is, H-Vth. Therefore, in the time interval t4, the sensing pixel 110 may output the sensed signal to the control circuit 120 through the sensing line SL, and the sensed signal is a signal obtained by the sensing pixel 110 sensing the reflected light L2.

Therefore, in the Step S120, when the finger 200 is close to the light source 300, a sampling result of the second output terminal OUTb in the Step S130 is the high-level voltage H minus the threshold voltage Vth of the driving transistor T_dri, that is, H-Vth, which means that the light detection element 100 detects that the finger 200 is close to the light source 300. Conversely, in the Step S120, when the finger 200 does not exist, the sampling result of the second output terminal OUTb in the Step S130 is the low-level voltage L, which means that the finger 200 does not exist, and the light detection element 100 does not detect the finger 200 to be close to the light source 300.

With reference to FIG. 2 again, in the embodiment, the control circuit 120 includes a readout circuit 410, an arithmetic circuit 420, and a system circuit 430. The readout circuit 410 includes a signal receiving circuit 412. The readout circuit 410 reads the sensed signal outputted by the sensing pixel 110 through the sensing line SL. As mentioned above, when the read sensed signal is the low-level voltage L, it means that the finger 200 does not exist, while when the read sensed signal is the high-level voltage H-Vth, it means that the light detection element 100 detects the finger 200 to be close to the light source 300. Therefore, the sensed signal received by the signal receiving circuit 412 in the readout circuit 410 is in a form of a digital signal, and a detection result may be represented by two different level states. Therefore, there is no need to dispose an additional analog-to-digital converter in the readout circuit 410 to convert the sensed signal into a digital signal. Then, the arithmetic circuit 420 receives the sensed signal outputted by the signal receiving circuit 412, so as to calculate a position touched by the finger 200, and then transmits the touch position to the system circuit 430 for subsequent processing.

In the embodiment in FIG. 2, each of the transistors in the sensing pixel 110 is implemented as an N-type transistor, but the disclosure is not limited thereto. In another embodiment, each of the transistors in the sensing pixel 110 may also be implemented as a P-type transistor.

Figure 5:
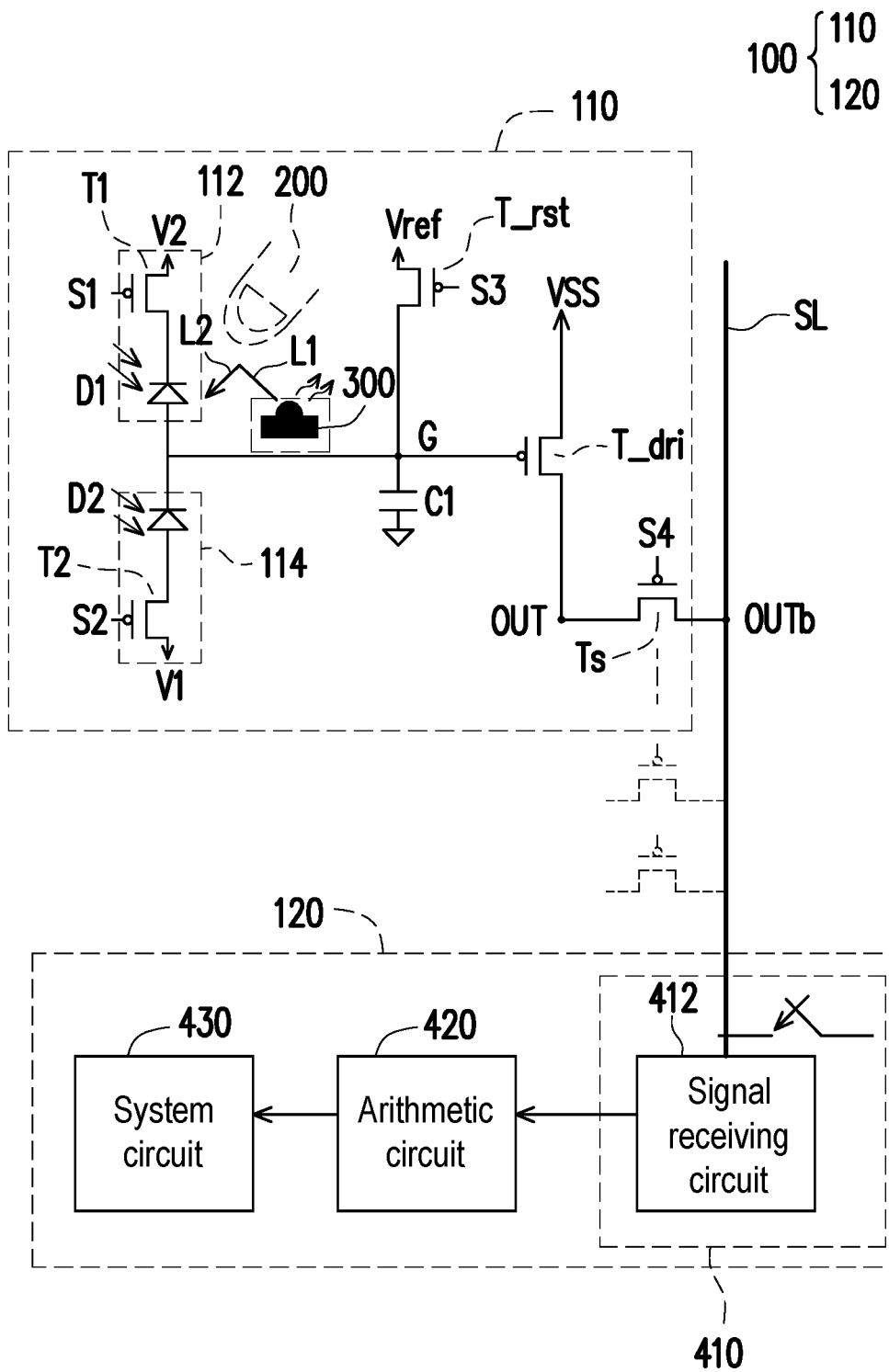
FIG. 5 is a schematic structural diagram of a light detection element according to an embodiment of the disclosure.
Figure 6:
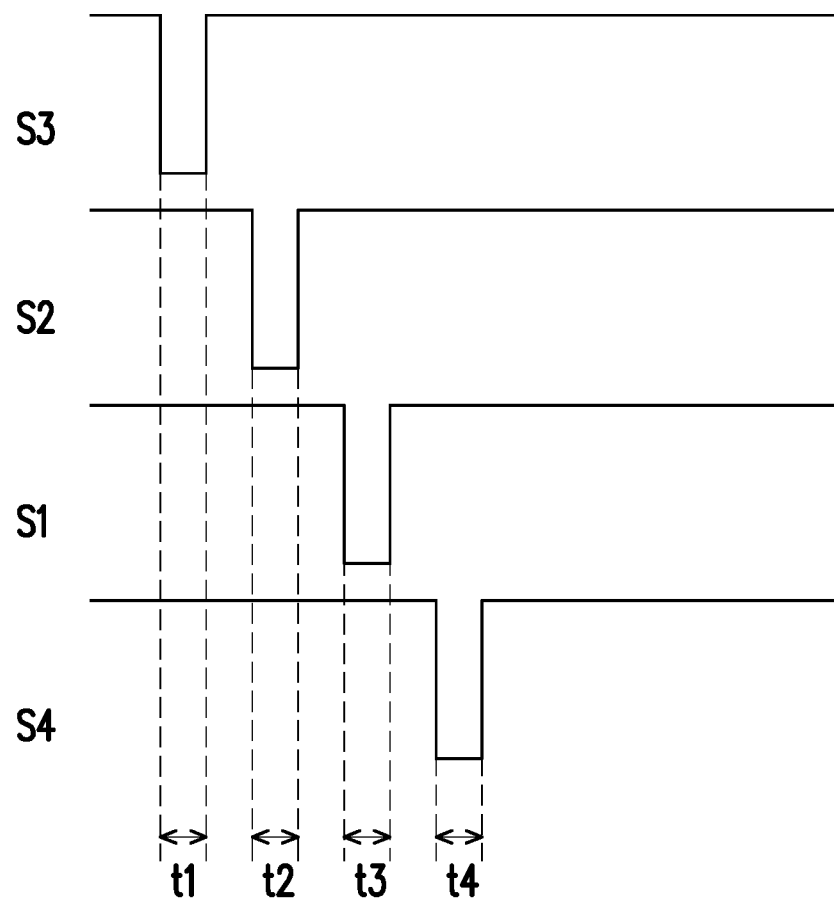
FIG. 6 is a signal timing diagram of the control signal configured to control each of the transistors of the embodiment in FIG. 5.

FIG. 5 is a schematic structural diagram of a light detection element according to an embodiment of the disclosure. FIG. 6 is a signal timing diagram of the control signal configured to control each of the transistors of the embodiment in FIG. 5. With reference to FIGS. 2, 5, and 6, the light detection element 100 of the embodiment is similar to the light detection element of the embodiment in FIG. 2, and a main difference between the two is, for example, each of the transistors in the sensing pixel 110 in FIG. 5 is implemented as a P-type transistor. Correspondingly, a level of the control signal used to control a turned-on state of each of the transistors in FIG. 6 is adjusted from a high level to a low level.

In the embodiments in FIGS. 1 to 6, when a light source path detected by the light detection element 100 is reflective, the non-display light source 300 is used as a detection light source, and a timing of the light source 300 being lit is in synchronization with a timing of the first transistor T1 being turned on, so that the first light sensing unit D1 detects the reflected light. This can prevent the detection result from being affected by the light source that is used for display and improve accuracy of detection by the light detection element 100. In addition, the light detection element 100 controls the first transistor T1 and the second transistor T2 to be turned on in a time-sharing manner, so as to charge and discharge the storage capacitor C1, which can effectively reduce impact of noise on the detection result and prevent misjudgment by the light detection element 100.

In the embodiments in FIGS. 1 to 6, the light detection element 100 detects the reflected light L2 coming from the object 200, but the disclosure is not limited thereto. In other embodiments, the light detection element 100 may also be used to detect a light source that is directly outputted by another object.

Figure 7:
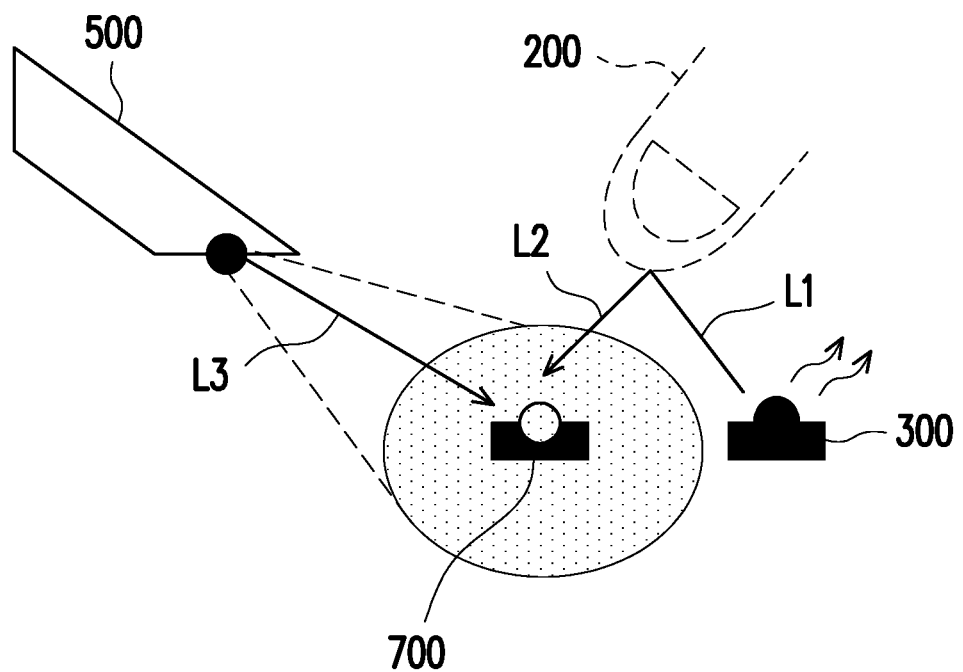
FIG. 7 is a schematic diagram of a light detection element configured to detect the reflected light and a direct light according to an embodiment of the disclosure.

FIG. 7 is a schematic diagram of a light detection element configured to detect the reflected light and a direct light according to an embodiment of the disclosure. With reference to FIG. 7, a light detection element 700 of the embodiment may be configured to detect a light L3 that is actively emitted by another object 500, in addition to being configured to detect the reflected light L2. For example, the object 500 is a laser pointer or other similar devices that actively emit the light L3. Therefore, in the embodiment, the light detection element 700 may also detect a light source outputted by the laser pointer 500.

Figure 8:
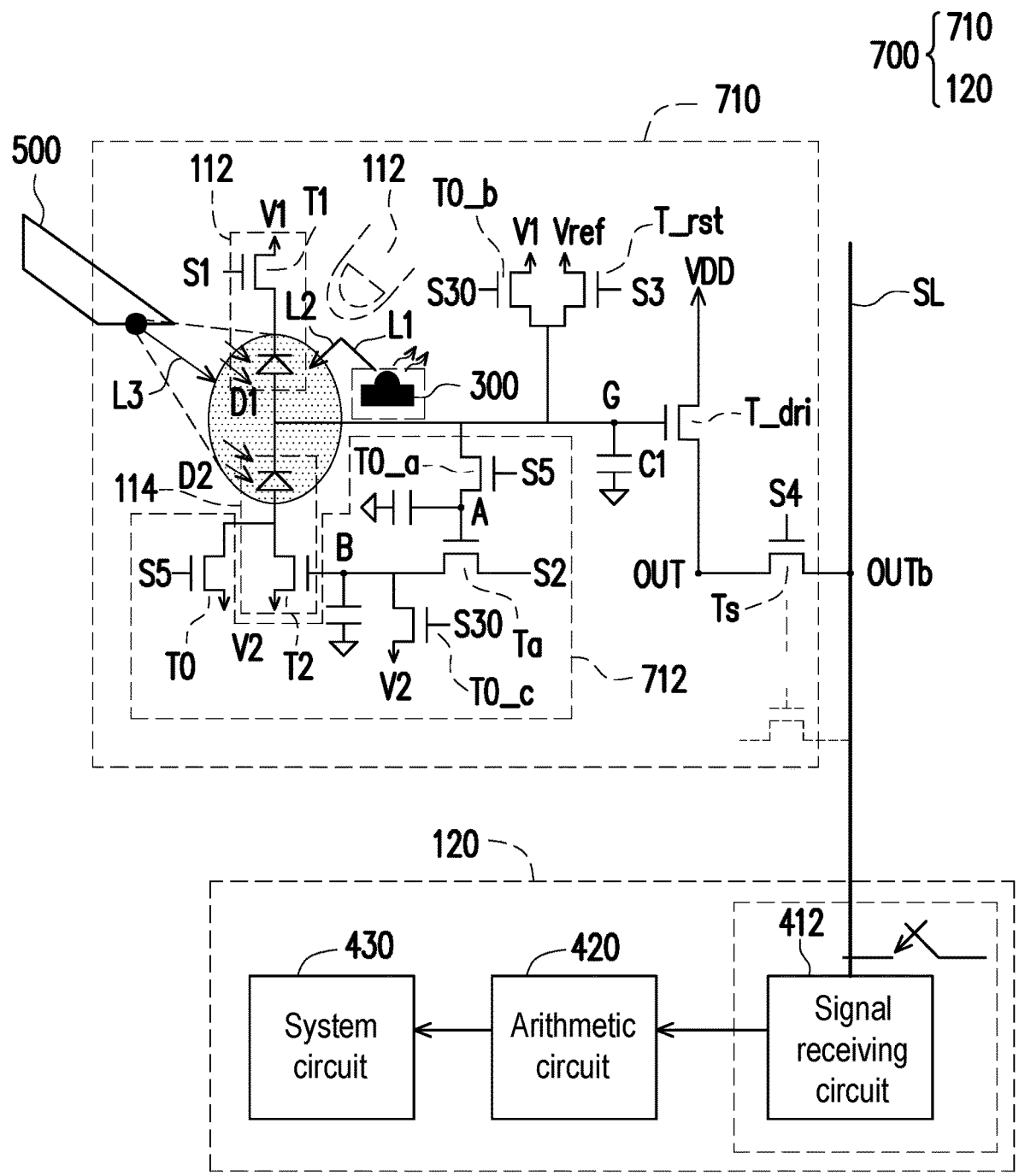
FIG. 8 is a schematic structural diagram of the light detection element of the embodiment in FIG. 7.

FIG. 8 is a schematic structural diagram of the light detection element of the embodiment in FIG. 7. With reference to FIG. 8, the light detection element 700 of the embodiment includes a sensing pixel 710 and the control circuit 120. The sensing pixel 710 is connected to the control circuit 120 through the sensing line SL, so as to transmit the sensed signal to the control circuit 120. The sensing pixel 710 also includes a feedback circuit 712, which is configured to determine whether the reflected light L2 or the direct light L3 is detected by the light detection element 700.

Figure 9:
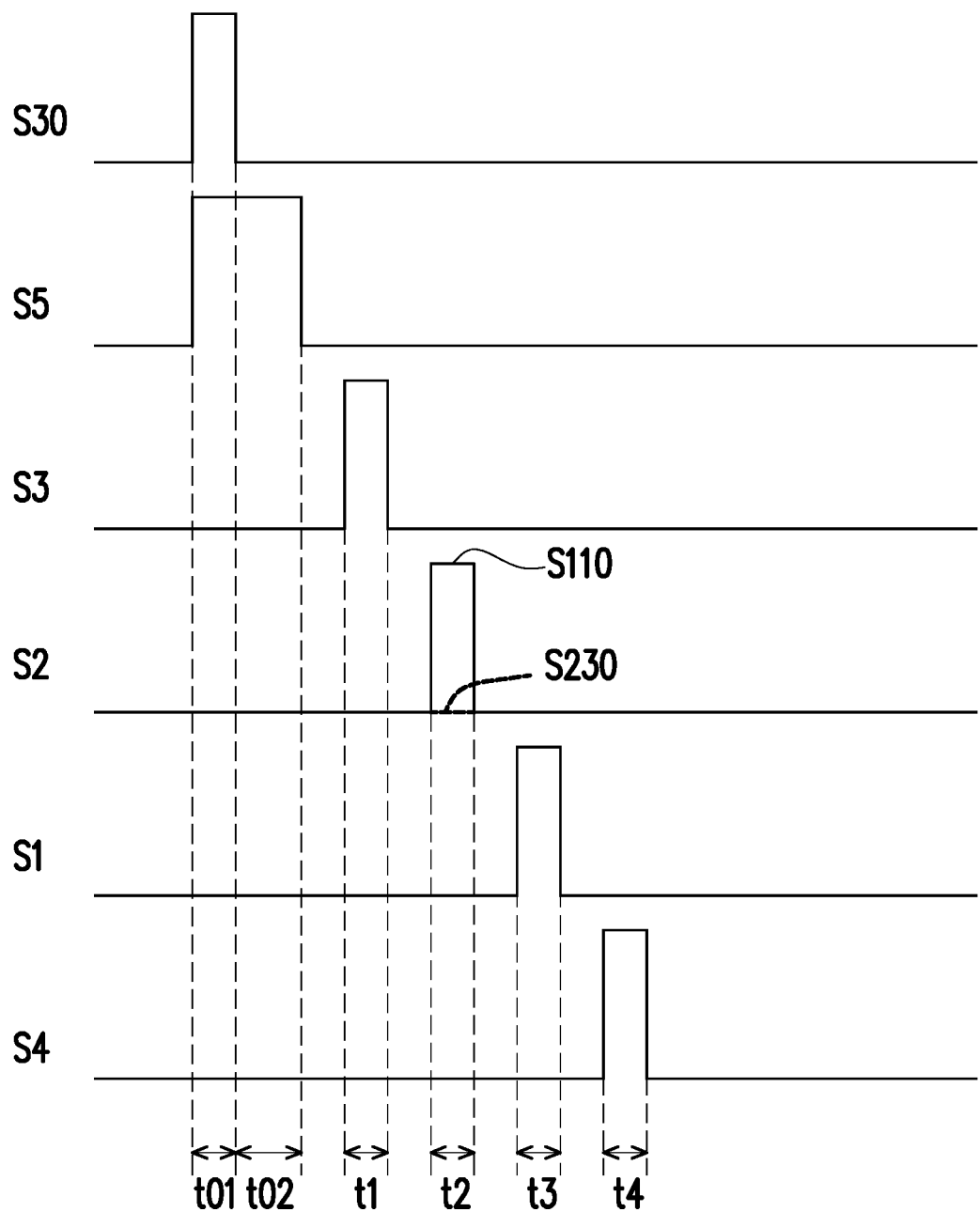
FIG. 9 is a signal timing diagram of a control signal configured to control each transistor of the embodiment in FIG. 8.
Figure 10:
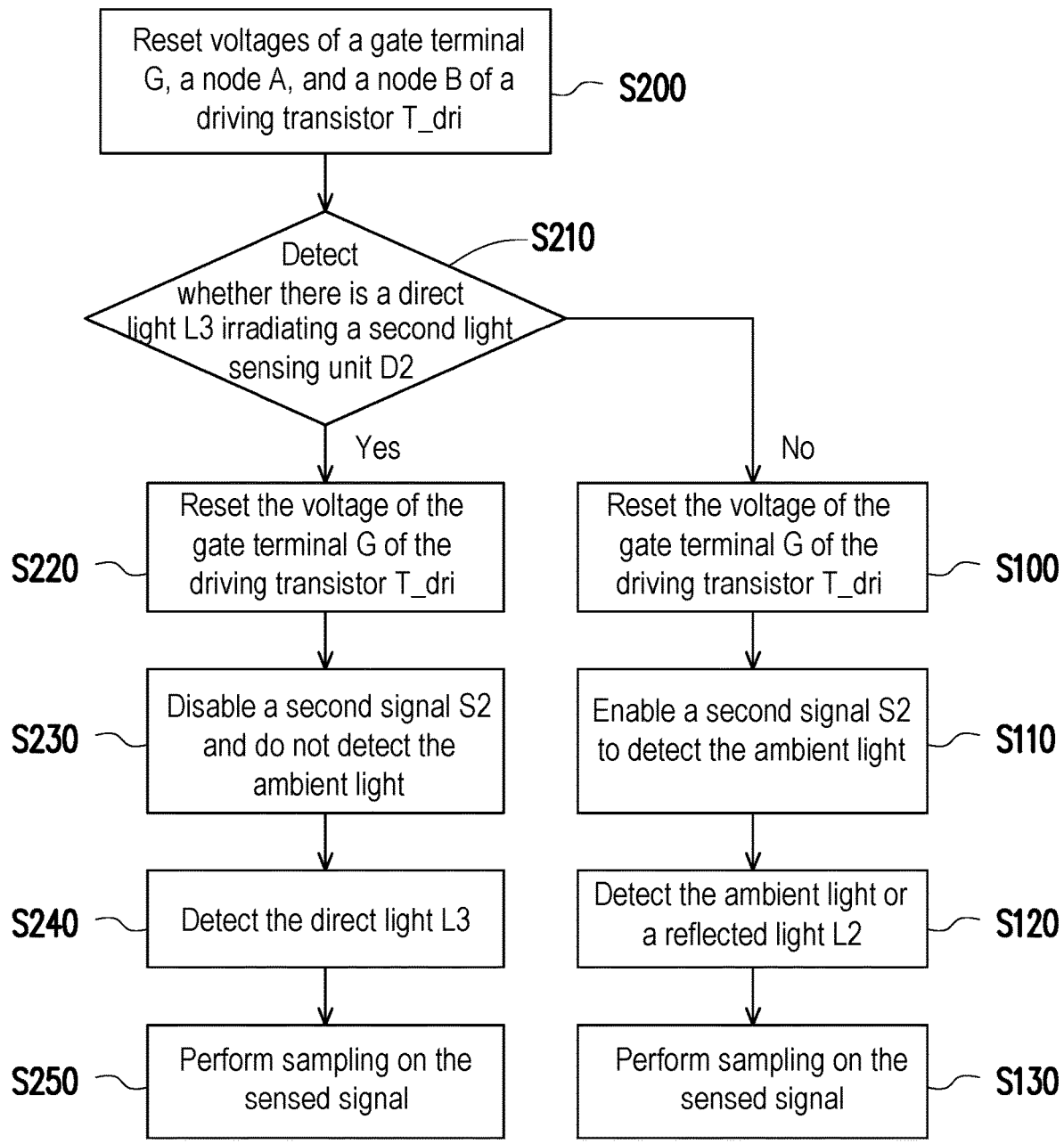
FIG. 10 is an operation flowchart of the light detection element of the embodiment in FIG. 8.

Specifically, FIG. 9 is a signal timing diagram of a control signal configured to control each transistor of the embodiment in FIG. 8. FIG. 10 is an operation flowchart of the light detection element of the embodiment in FIG. 8. With reference to FIGS. 8 to 10, in Step S200, a reset signal S30 turns on transistors T0_b and T0_c in a time interval t01, so as to respectively reset the gate terminal G and a node B to the high-level voltage H and the low-level voltage L. At the same time, a reset signal S5 turns on a transistor T0_a in the time interval t01, so as to reset a node A to the high-level voltage H. In the time interval t01, since the gate terminal G is at the high-level voltage H, the driving transistor T_dri is turned on.

In Step S210, the reset signal S5 continuously turns on a transistor T0 in a time interval t02, so as to detect whether the direct light L3 is irradiating the second light sensing unit D2. When the direct light L3 irradiates the second light sensing unit D2, the voltage of the gate terminal G is pulled down to the low-level voltage L. On the contrary, when the direct light L3 is not irradiating the second light sensing unit D2, the voltage of the gate terminal G is maintained at the high-level voltage H.

In the scenario where the direct light L3 is not irradiating the second light sensing unit D2, an operation flow of the light detection element 700 executes the Steps S100, S110, S120, and S130 to detect the reflected light L2. In the Step S110, the control circuit 120 enables the second signal S2 in the time interval t2, so as to turn on the second transistor T2, thereby allowing the second light sensing unit D2 to detect the ambient light. In the embodiment in FIG. 10, sufficient teaching, suggestion and implementation description may be inferred from the embodiment in FIG. 4 for an operation method of detecting the reflected light L2, which is not repeated here.

In the scenario where the direct light L3 irradiates the second light sensing unit D2, an operation flow of the light detection element 700 executes Step S220. In the Step S220, the reset signal S3 turns on the reset transistor T_rst in the time interval t1, so as to reset a terminal of the storage capacitor C1 to the reference voltage Vref. That is, the voltage of the gate terminal G of the driving transistor T_dri is reset to the reference voltage Vref. Therefore, the voltage of the first output terminal OUT is the reference voltage Vref minus the threshold voltage Vth of the driving transistor T_dri, that is, Vref-Vth, and the voltage of the second output terminal OUTb, at this time, is the low-level voltage L. In the time interval t1, the first transistor T1 and the second transistor T2 are not turned on.

In Step S230, the control circuit 120 disables the second signal S2 in the time interval t2, so that the second transistor T2 is not turned on, and the second light sensing unit D2 does not detect the ambient light. That is, the control circuit 120 may be configured to determine whether to allow the second signal S2 to control the second transistor T2. In detail, the control circuit 120 may include, for example, a circuit (not shown) electrically connected to the second transistor T2.

In Step S240, the light detection element 700 is configured to detect, for example, the direct light L3 outputted by the laser pointer 500. The first signal S1 turns on the first transistor T1 in the time interval t3, thereby allowing the first light sensing unit D1 to detect the ambient light. In the time interval t3, the second transistor T2 and the reset transistor T_rst are not turned on. When the direct light L3 irradiates the first light sensing unit D1, the first light sensing unit D1 detects the direct light L3, and the high-level voltage V1 charges the storage capacitor C1, so that the voltage at the gate terminal G is pulled up to the high-level voltage H, so as to turn on the driving transistor T_dri. Therefore, the voltage of the first output terminal OUT is the high-level voltage H minus the threshold voltage Vth of the driving transistor T_dri, that is, H-Vth.

Next, in Step S250, the light detection element 700 performs sampling on the sensed signal. In the time interval t4, the sampling signal S4 turns on the sampling transistor Ts. In time interval t4, the first transistor T1, the second transistor T2, and the reset transistor T_rst are not turned on. The voltage of the second output terminal OUTb is the high-level voltage H minus the threshold voltage Vth of the driving transistor T_dri, that is, H-Vth. Therefore, in time interval t4, the sensing pixel 110 may output the sensed signal to the control circuit 120 through the sensing line SL, and the sensed signal is the signal obtained by the sensing pixel 110 sensing the direct light L3.

Therefore, in the Step S240, when the direct light L3 irradiates the first light sensing unit D1, a sampling result of the second output terminal OUTb in the Step S250 is the high-level voltage H minus the threshold voltage Vth of the driving transistor T_dri, that is, H-Vth, which means that the direct light L3 is irradiating the first light sensing unit D1.

With reference to FIG. 8 again, in the embodiment, the control circuit 120 includes the readout circuit 410, the arithmetic circuit 420, and the system circuit 430. The readout circuit 410 includes the signal receiving circuit 412. The readout circuit 410 reads the sensed signal outputted by the sensing pixel 110 through the sensing line SL. As mentioned above, in the Step S210, when the voltage of the gate terminal G is at the low-level voltage L, it means that the direct light L3 is irradiating the second light sensing unit D2, while when the voltage of the gate terminal G is at the high-level voltage H, it means that the direct light L3 is not irradiating the second light sensing unit D2. Therefore, the control circuit 120 may determine whether the direct light L3 is irradiating the second light sensing unit D2 accordingly. When the direct light L3 irradiates the second light sensing unit D2, the control circuit 120 enables the second signal S2 in the Step S110, so as to turn on the second transistor T2, thereby allowing the second light sensing unit D2 to detect the ambient light. When the direct light L3 is not irradiating the second light sensing unit D2, the control circuit 120 disables the second signal S2 in the Step S230, therefore the second transistor T2 is not turned on, and the second light sensing unit D2 does not detect the ambient light. Then, the arithmetic circuit 420 receives the sensed signal outputted by the signal receiving circuit 412, so as to calculate the position touched by the finger 200, and then transmits the touch position to the system circuit 430, and the disabled/enabled second signal S2 is outputted by the system circuit 430 to the sensing pixel 710.

In the embodiment in FIG. 8, each of the transistors in the sensing pixel 710 is implemented as an N-type transistor, but the disclosure is not limited thereto. In another embodiment, each of the transistors in the sensing pixel 710 may also be implemented as a P-type transistor.

Figure 11:
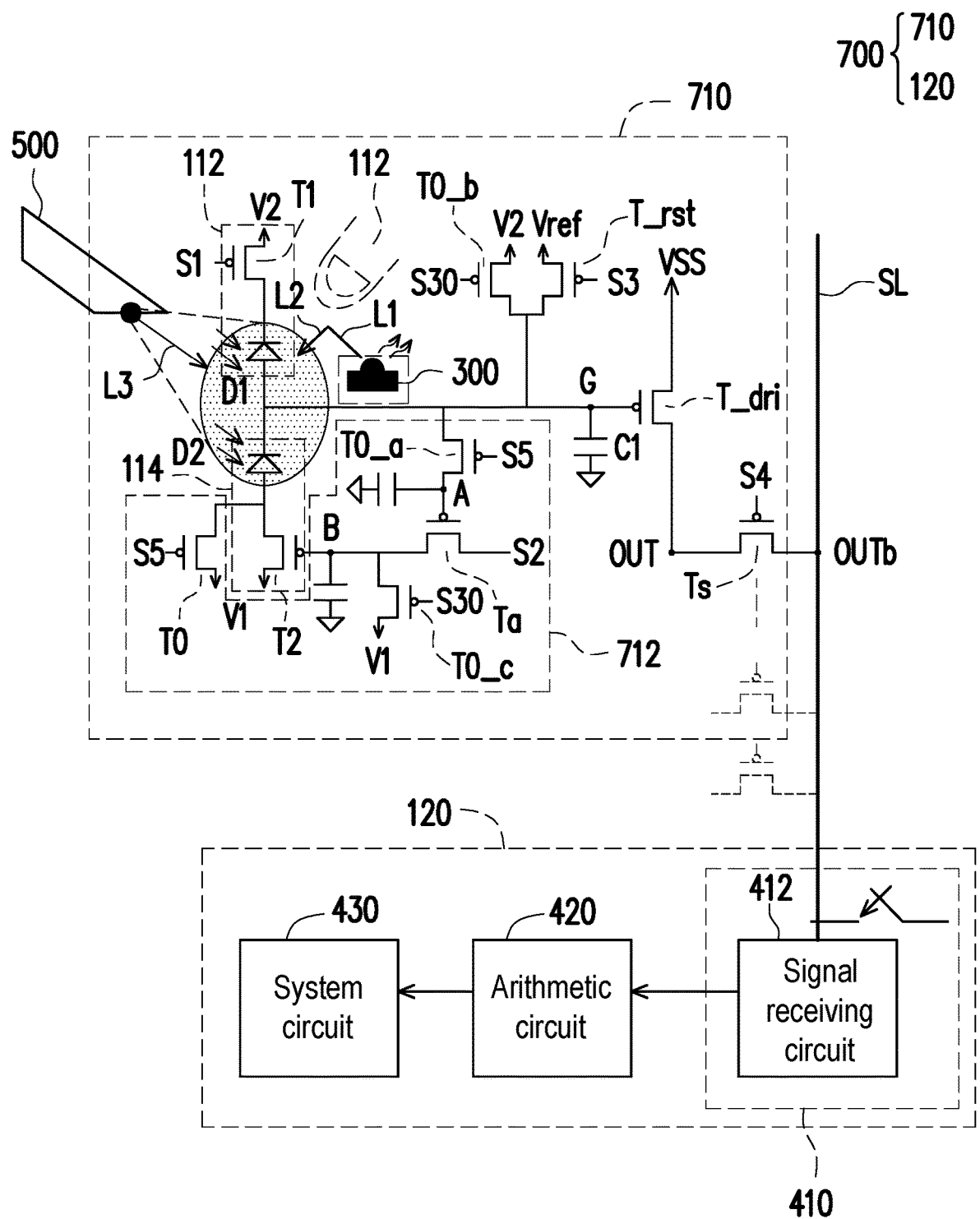
FIG. 11 is a schematic structural diagram of a light detection element according to an embodiment of the disclosure.
Figure 12:
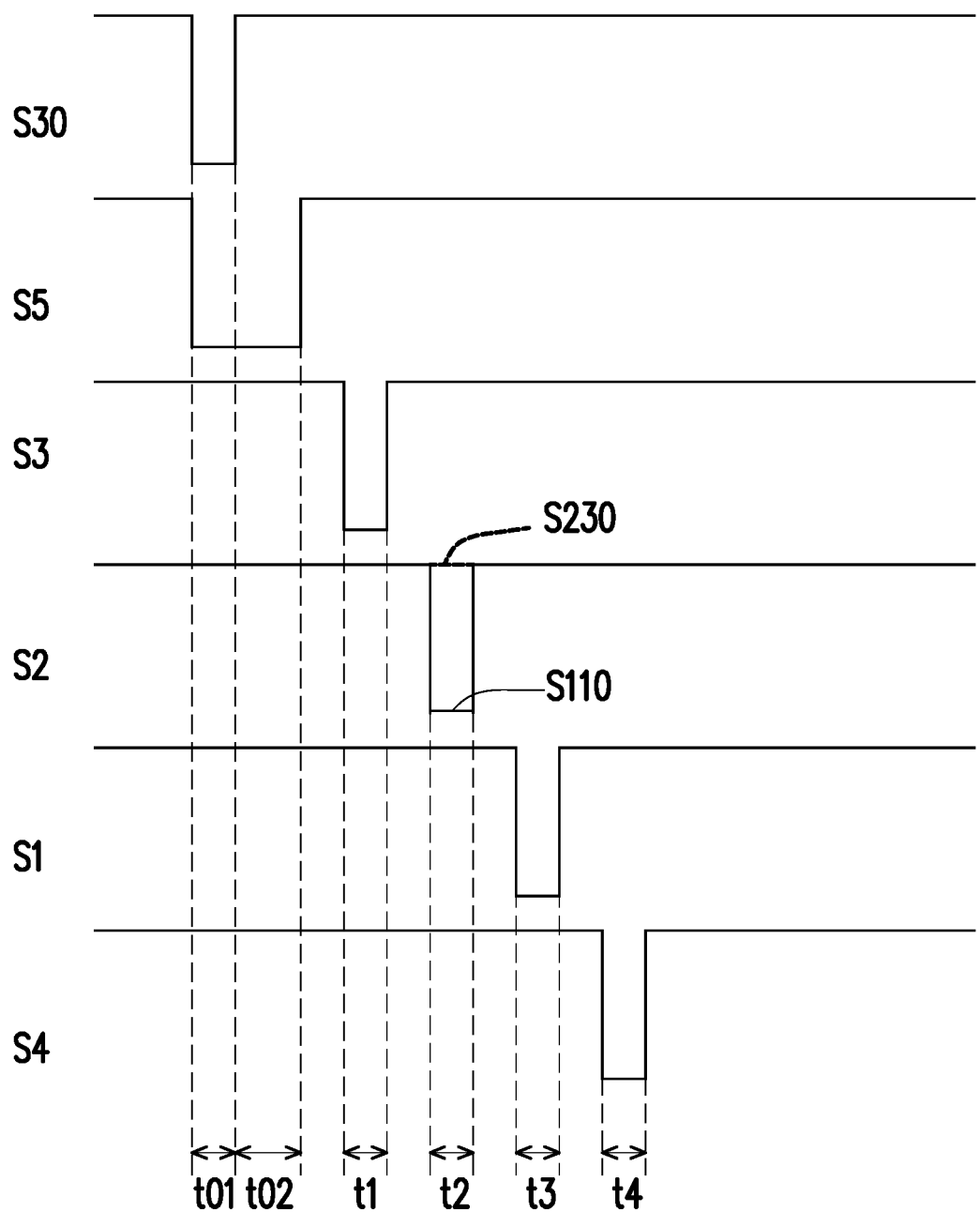
FIG. 12 is a signal timing diagram of the control signal configured to control each of the transistors of the embodiment in FIG. 11.

FIG. 11 is a schematic structural diagram of a light detection element according to an embodiment of the disclosure. FIG. 12 is a signal timing diagram of the control signal configured to control each of the transistors of the embodiment in FIG. 11. With reference to FIGS. 8, 11, and 12, the light detection element 700 of the embodiment is similar to the light detection element of the embodiment in FIG. 8, and a main difference between the two is, for example, each of the transistors in the sensing pixel 710 in FIG. 11 is implemented as a P-type transistor. Correspondingly, a level of the control signal used to control a turned-on state of each of the transistors in FIG. 12 is adjusted from a high level to a low level.

In the embodiments in FIGS. 7 to 12, the light detection element 700 may be configured to detect the direct light L3 in addition to being configured to detect the reflected light L2. The light detection element 700 includes the feedback circuit 712 to determine whether the reflected light L2 or the direct light L3 is detected by the light detection element 700.

In summary, when the light source path detected by the light detection element is reflective, the non-display light source is used as the detection light source, and the timing of the light source being lit is synchronized with the timing of the first transistor being turned on, so that the first light sensing unit detects the reflected light. This can prevent the detection result from being affected by the light source that is used for display and improve the accuracy of the detection by the light detection element. In addition, the light detection element controls the first transistor and the second transistor to be turned on in the time-sharing manner, so as to charge and discharge the storage capacitor, which can effectively reduce the impact of nose on the detection result, thereby preventing misjudgment by the light detection element. The light detection element may be configured to detect the direct light in addition to being configured to detect the reflected light. The light detection element includes the feedback circuit to determine whether the reflected light or the direct light is detected by the light detection element.

Finally, it should be noted that the foregoing embodiments are only used to illustrate the technical solutions of the disclosure, and not intended to limit the disclosure. Although the disclosure has been described in detail with reference to the foregoing embodiments, persons skilled in the art should understand that modifications to the technical solutions described in the foregoing embodiments or equivalent replacements may be made to some or all of the technical features. However, the modifications or replacements do not cause the essence of the corresponding technical solutions to depart from the scope of the technical solutions according to the embodiments of the disclosure.

What is claimed is:

1. A light detection element, comprising:
a first light detection unit, comprising a first transistor and a first light sensing unit, wherein the first transistor and the first light sensing unit are electrically connected;
a second light detection unit, electrically connected to the first light detection unit, comprising a second light sensing unit and a second transistor, wherein the second light sensing unit and the second transistor are electrically connected;
a driving transistor, having a gate terminal, wherein the gate terminal is electrically connected to the first light sensing unit and the second light sensing unit,
wherein in a time interval, the first transistor is not turned on and the second transistor is turned on, wherein the first transistor is controlled by a first signal, and the second transistor is controlled by a second signal;
a control circuit, configured to determine whether to allow the second signal to control the second transistor; and
a feedback circuit, configured to determine that a direct light is detected by the light detection element when a voltage at the gate terminal is a third voltage, or configured to determine that a reflected light is detected by the light detection element when a voltage at the gate terminal is a fourth voltage.

2. The light detection element according to claim 1, further comprising:
a light source, wherein the light source operates synchronously with the first transistor.

3. The light detection element according to claim 1, wherein a terminal of the first transistor is coupled to a first voltage, and a terminal of the second transistor is coupled to a second voltage, and an electric potential of the first voltage is different from an electric potential of the second voltage.

4. The light detection element according to claim 1, wherein the control circuit comprises a readout circuit.

5. The light detection element according to claim 1, wherein the control circuit enables the second signal when the feedback circuit determined that the direct light is detected by the light detection element, so as to allow the second signal to control the second transistor to be turned on.

6. The light detection element according to claim 1, wherein the control circuit disables the second signal when the feedback circuit determined that the reflected light is detected by the light detection element, so as to allow the second signal to control the second transistor to not be turned on.

7. A light detection element, comprising:
a control circuit;
a sensing pixel, connected to the control circuit through a sensing line, so as to transmit a sensed signal to the control circuit, the sensing pixel comprising:
a first transistor;
a second transistor; and
a driving transistor,
wherein in a time interval, the first transistor is not turned on and the second transistor is turned on, wherein the first transistor is controlled by a first signal and the second transistor is controlled by a second signal, wherein the control circuit is configured to determine whether to allow the second signal to control the second transistor; and
a feedback circuit, configured to determine that a direct light is detected by the light detection element when a voltage at a gate terminal is a third voltage, or configured to determine that a reflected light is detected by the light detection element when a voltage at a gate terminal is a fourth voltage.

8. The light detection element according to claim 7, wherein the sensing pixel comprises:
a first light detection unit, comprising the first transistor and a first light sensing unit, wherein the first transistor and the first light sensing unit are electrically connected; and
a second light detection unit, electrically connected to the first light detection unit, comprising a second light sensing unit and the second transistor, wherein the second light sensing unit and the second transistor are electrically connected;
wherein the driving transistor has a gate terminal, and the gate terminal is electrically connected to the first light sensing unit and the second light sensing unit.

9. The light detection element according to claim 7, further comprising:
a light source, wherein the light source operates synchronously with the first transistor.

10. The light detection element according to claim 7, wherein a terminal of the first transistor is coupled to a first voltage, and a terminal of the second transistor is coupled to a second voltage, and an electric potential of the first voltage is different from an electric potential of the second voltage.

11. The light detection element according to claim 7, wherein the control circuit enables the second signal when the feedback circuit determined that the direct light is detected by the light detection element, so as to allow the second signal to control the second transistor to be turned on.

12. The light detection element according to claim 7, wherein the control circuit disables the second signal when the feedback circuit determined that the reflected light is detected by the light detection element, so as to allow the second signal to control the second transistor to not be turned on.

* * * * *